(12) United States Patent
Koyama et al.

(10) Patent No.: US 6,792,121 B2
(45) Date of Patent: Sep. 14, 2004

(54) AUDIO SIGNAL AMPLIFIER CIRCUIT AND PORTABLE TELEPHONE SET AND PORTABLE ELECTRONIC DEVICE USING THE SAME AUDIO SIGNAL AMPLIFIER CIRCUIT

(75) Inventors: Yasuyuki Koyama, Kyoto (JP); Masanori Fujisawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 571 days.

(21) Appl. No.: 09/832,994

(22) Filed: Apr. 12, 2001

(65) Prior Publication Data

US 2001/0030579 A1 Oct. 18, 2001

(30) Foreign Application Priority Data

Apr. 17, 2000 (JP) .......................... 2000-115181
Apr. 3, 2001 (JP) .......................... 2001-104321

(51) Int. Cl.[7] .............................................. H03F 21/00
(52) U.S. Cl. ...................... 381/120; 381/121; 381/111; 330/260; 330/262
(58) Field of Search ................................ 381/120, 121, 381/111, 96; 330/262, 260

(56) References Cited

U.S. PATENT DOCUMENTS 4,649,565 A * 3/1987 Kaizer et al. ................. 381/96

5,787,182 A * 7/1998 Hoshino et al. .............. 381/74

* cited by examiner

*Primary Examiner*—Xu Mei
*Assistant Examiner*—Justin Michalski
(74) *Attorney, Agent, or Firm*—Mattingly Stanger & Malur, P.C.

(57) ABSTRACT

An audio signal amplifier circuit includes an external output terminal of an IC to which an output line of a power amplifier circuit is connected, a first resistor connected between a certain terminal of the IC other than the external output terminal and a feedback input of a differential amplifier circuit, a first capacitor connected between the external output terminal and a loud speaker, a second capacitor between the certain terminal of the IC and a wiring line between the external output terminal and the loud speaker, a filter circuit provided on a signal input side of the differential amplifier circuit and including a second resistor and a third capacitor for attenuating signal components having frequencies in a middle and high frequency ranges and voltage follower means provided between an input stage and an output stage of the audio signal amplifier circuit, wherein the first capacitor is a small capacitor having a capacitance value in the order of 30 $\mu$F or smaller and an attenuation characteristics of the first capacitor and an impedance of the loud speaker in a low frequency range is compensated for by a relative amount of increase of amplification gain in the low frequency range determined by a time constant of the second capacitor and the first resistor and a time constant of the third capacitor and the second resistor.

16 Claims, 2 Drawing Sheets

AUDIO SIGNAL AMPLIFIER CIRCUIT AND PORTABLE TELEPHONE SET AND PORTABLE ELECTRONIC DEVICE USING THE SAME AUDIO SIGNAL AMPLIFIER CIRCUIT

BACKGROUND OF THE INVENTION

1. Field of the Invention

The present invention relates to an audio signal amplifier circuit and a portable telephone set and a portable electronic device using the same amplifier circuit and, particularly, to an audio signal amplifier circuit of a portable telephone set or a portable electronic device, which can amplify an audio signal with high tone quality even when a capacitor externally mounted to an audio output amplifier of an IC of the portable telephone set or the portable electronic device is reduced in size to such as a chip capacitor.

2. Description of the Related Art

A conventional portable magnetic tape player such as a headphone stereo or a DAT or a conventional portable disk payer such as a MD or a CD is driven by one dry battery or two dry batteries at most. Therefore, a power source voltage of an audio amplifier circuit is 1.2 V or 2.4 V at most. Further, the audio signal amplifier circuit must be compact and thin and, recently, the audio signal amplifier circuit is requested to amplify enough an audio signal in a low frequency range with high tone quality.

On the other hand, a power source voltage of an audio signal amplifier circuit of a portable telephone set of such as a portable telephone system or a PHS (Personal Handyphone System), in which tone quality as high as the level of the audio signal amplifier circuit of the above mentioned portable magnetic player or the portable disk player is not required, is about 3.3 V and an improvement of frequency characteristics of the audio signal amplifier circuit has been required in order to improve an output voice quality. In addition, the audio signal amplifier circuit of the portable telephone set must be more compact, thin and light in weight compared with a portable audio equipment. Further, it is requested recently to amplify not only voice but also music.

A problem of the audio signal amplifier circuit of the portable audio equipment having thickness to be reduced resides in a capacitance of an output capacitor externally mounted to an output circuit of the amplifier circuit formed as an IC. When a cut-off frequency of the audio signal amplifier circuit in a low frequency range is set to about 20 Hz, a capacitor having a capacitance in a range from 330 µF to 2200 µF is necessary when a load, that is, an impedance of a loud speaker, is in a range from 4 Ω to 32 Ω.

This problem can be solved by the technique disclosed in U.S. Pat. No. 5,787,182 which is assigned to the assignee of the present invention and in which it is possible to reduce a capacitance of an output capacitor of an audio signal amplifier circuit by about 30% at an appropriate signal frequency.

On the other hand, in an audio signal amplifier circuit of a portable telephone set having a casing smaller and thinner than that of a portable audio equipment, the externally attached output capacitor has to be not a electrolytic capacitor but a chip capacitor. In such case, the capacitance of the externally attached capacitor becomes about 30 µF at most.

When an audio amplifier circuit is realized by externally attaching a capacitor having such small capacitance by applying the content of U.S. Pat. No. 5,787,182, frequency characteristics of the audio amplifier circuit in a low frequency range is degraded, causing voice to be hardly heard. Further, the technique disclosed in U.S. Pat. No. 5,787,182 includes a filter having a capacitor provided on an output side of an amplifier circuit, for compensating for the low frequency range characteristics thereof. Therefore, in a portable telephone set using a high frequency clock, there is another problem that the amplifier circuit tends to oscillate due to noise generated thereby. In order to solve this problem, it is necessary to separately provide an oscillation preventing circuit. In such case, however, the number of circuits, which are to be integrated, becomes increased correspondingly and the number of parts, which are to be added externally, is also increased. Therefore, the addition of the oscillation preventing circuit is not preferable as an audio signal amplifier circuit of a portable telephone set.

Incidentally, as an audio signal amplifier circuit requiring high tone quality, there is a portable electronic equipment such as PDA (Personal Digital Assistance). However, PDA involves a similar problem to that mentioned above.

SUMMARY OF THE INVENTION

An object of the present invention is to provide an audio signal amplifier circuit capable of amplifying an audio signal with high tone quality even when a capacitor to be externally attached to an audio output amplifier of the audio output amplifier formed as an IC is reduced in capacitance to such a chip capacitor.

Another object of the present invention is to provide a portable telephone set capable of amplifying voice with high tone quality even when a capacitor to be externally attached to an audio output amplifier of an audio output amplifier formed as an IC is reduced in capacitance to such as a chip capacitor.

A further object of the present invention is to provide a portable electronic equipment capable of amplifying voice with high tone quality even when a capacitor to be externally attached to an audio output amplifier of the audio output amplifier formed as an IC is reduced in capacitance to such as a chip capacitor.

In order to achieve the above objects, the audio signal amplifier circuit, which is usable as a unit, in the portable telephone set or in the portable electronic equipment and which is formed as an IC, comprises a differential amplifier circuit provided in an input stage of the audio signal amplifier circuit, a single-ended power amplifier circuit provided in an output stage thereof, an external output terminal of the IC, which is connected to an output line of the single-ended power amplifier circuit, a first resistor connected between a certain terminal of the IC other than the external output terminal and a feedback input of the differential amplifier circuit, a first capacitor connected between the external output terminal and a loud speaker as a load, a second capacitor between the certain terminal of the IC and a wiring line between the external output terminal and the loud speaker, a filter circuit provided on a signal input side of the differential amplifier circuit and including a second resistor and a third capacitor for attenuating signal components having frequencies in a middle and high frequency ranges and voltage follower means provided between the input stage and the output stage of the audio signal amplifier circuit, wherein the first capacitor is a small capacitor having a capacitance value in the order of 30 µF or smaller and an attenuation characteristics of a series circuit of the first capacitor and an impedance of the loud speaker in a low frequency range is compensated for by an amount of relative increase of amplification gain in the low frequency range, which is determined by a time constant of the second capacitor and the first resistor and a time constant of the third capacitor and the second resistor.

Since, in the construction of the audio signal amplifier circuit mentioned above, it is possible to use a small capacitor having a capacitance in the order of 30 μF. or smaller as the first capacitor, that is, the output capacitor, a chip capacitor can be used as the output capacitor. It becomes possible to amplify voice with high tone quality by compensating for the attenuation characteristics of the load circuit in the low frequency range due to reduction of capacitance of the output capacitor thereof by the filter circuits provided on the input and output sides of the audio signal amplifier circuit. Further, with the above mentioned construction, the audio signal amplifier circuit tends to oscillate due to the provision of the filter circuits on the input and output sides. In order to prevent the audio signal amplifier circuit from oscillating, the voltage followers are provided between the input stage and the output stage thereof to drive the current amplification loop thereby. Thus, the phase relation is regulated by this construction to prevent oscillation of the audio signal amplifier circuit. Therefore, it becomes possible to set the input dynamic range of the audio signal amplifier circuit large compared with the past without providing any special oscillation preventing circuit.

As a result, it becomes possible to easily realize a portable telephone set or a portable electronic device, which is capable of amplifying an audio signal with high tone quality even when the size of the capacitor of the output amplifier, which is externally connected to the IC, is reduced to the size of a chip capacitor.

DETAILED DESCRIPTION OF THE PREFERRED EMBODIMENTS

Figure 1:
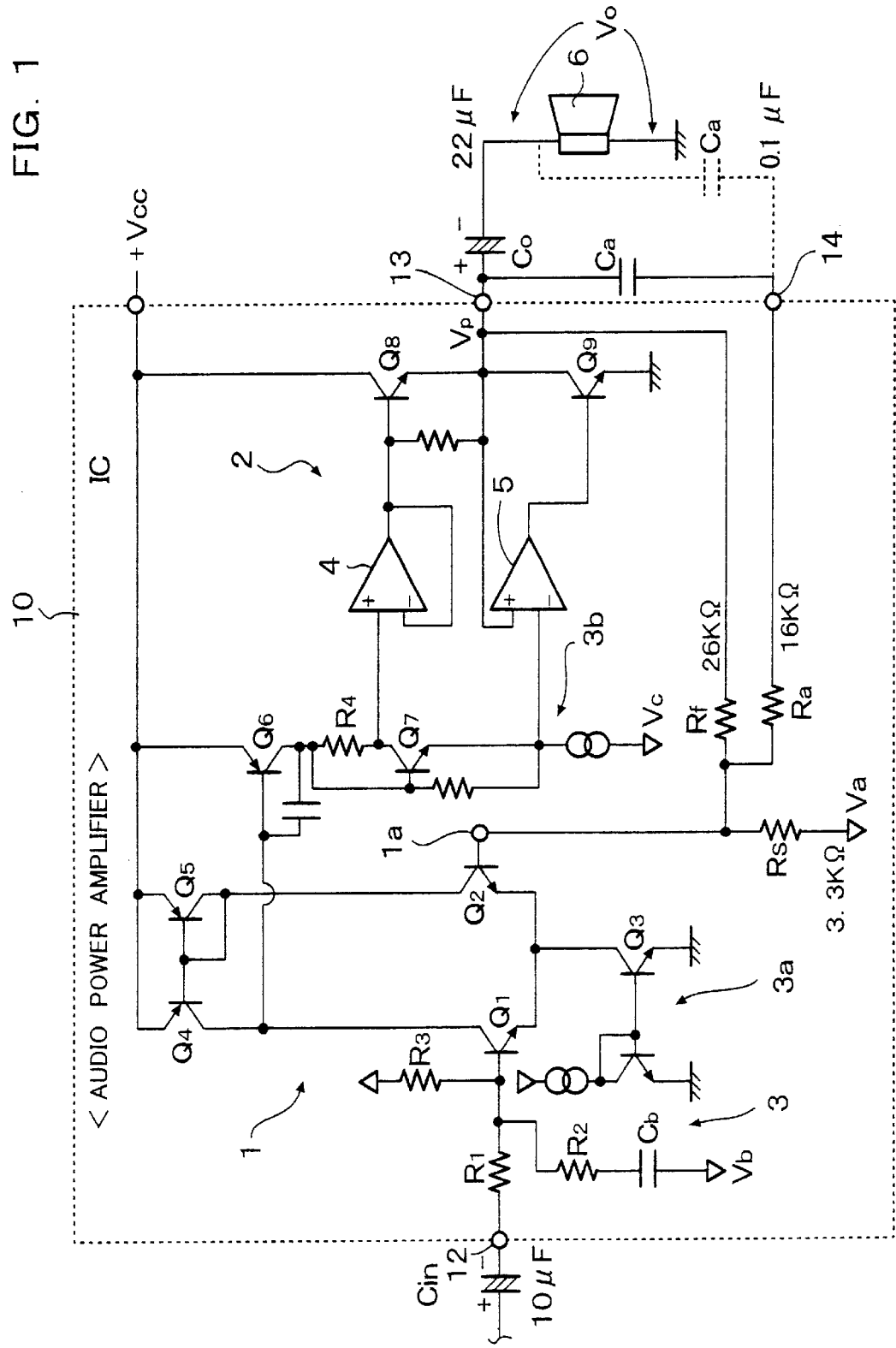
FIG. 1 is a block circuit diagram of an audio output circuit of an audio signal amplifier circuit according to an embodiment of the present invention, which is driven by a battery.

In FIG. 1, an audio power amplifier 10 is formed as an IC including an output amplifier circuit 2 having an input stage composed of a NPN type differential amplifier 1, a drive stage composed of a transistor Q6 and an output stage composed of an NPN type single-ended push-pull amplifier. A reference numeral 12 depicts an input terminal of the audio power amplifier and a reference numeral 13 depicts an output terminal of the audio power amplifier. A low frequency range boost circuit 3 is provided on an input side of the input stage.

The audio power amplifier circuit 10 further includes a feedback resistor Rf (=26 kΩ) for feeding an output voltage at the output terminal 13 back to the −input terminal (negative feedback side input terminal) 1a of the differential amplifier 1 and a reference side bias resistor Rs (=3.3 kΩ) connected between the −input terminal 1a and a bias line Va.

Further, the audio power amplifier circuit 10 includes a second feedback resistor Ra (=16 kΩ) between a terminal 14 of the IC and the −input terminal 1a of the differential amplifier 1 and a chip capacitor Ca having a capacitance of 0.1 μF. provided between the output terminal 13 and the terminal 14 as an external capacitor. Further, an output chip capacitor Co having a capacitance of 22 μF. is provided between the output terminal 13 and a loud speaker 6 as an external circuit. Incidentally, an input capacitor Cin having a capacitance of 10 μF. is connected in series with the input terminal 12 and is adapted to receive an audio signal. A resistance value of the loud speaker 6 is usually in a range from 4 Ω to 32 Ω.

The differential amplifier 1 is constructed with NPN differential transistors Q1 and Q2, an NPN transistor Q3 connected between common emitters of the transistors Q1 and Q2 and ground GND as a constant current source and PNP transistors Q4 and Q5 connected to respective collectors of the transistors Q1 and Q2 as active loads and constituting a current mirror. The collectors of the transistors Q1 and Q2 are connected to a power source line Vcc through the respective transistors Q4 and Q5. A reference numeral 3a depicts a constant voltage circuit for setting the transistor Q3 as the constant current source.

A base of the transistor Q1 of the differential amplifier 1 is connected as a +input terminal to the input terminal 12 through a resistor R1 and a base of the transistor Q2 of the differential amplifier 1 is connected to the −input terminal 1a. An output of the differential amplifier 1 is derived from the collector side of the transistor Q1 and is inputted to a base of a PNP transistor Q6 in the drive stage.

A reference numeral R3 depicts a bias resistor for biasing the base of the transistor Q1.

The low frequency range boost circuit 3 is a low pass filter, which attenuates or cuts off a middle and high frequency ranges, composed of a series circuit of a resistor R2 and a capacitor Cb and connected between the base of the transistor Q1 of the differential amplifier 1 and a bias voltage source Vb. The capacitor Cb has a chip capacitance of 0.35 μF. and a value of the resistor R2 is in the order of 1 kΩ. With this series circuit, the middle and high frequency components are at least attenuated. Therefore, the low frequency component of the input signal is relatively increased. Further, by making amplification of the audio power amplifier 10 large, a lowered level of the low frequency component due to reduction of the capacitance of the output capacitor Co is relatively risen up. For example, a resistance value of the capacitor Cb at 1 kHz becomes in the order of 450 Ω and the level of the signal component having frequency equal to or higher than 500 Hz is substantially lowered.

The output amplifier circuit 2 is constructed with an NPN transistor Q7 connected, through a resistor R4, to a downstream side of the transistor Q6 connected between the power source line Vcc and the bias line Vc, a constant current source 3b connected between the transistor Q7 and the bias line Vc, voltage followers 4 and 5 having inputs connected to the collector and the emitter of the transistor Q7, respectively, and NPN output transistors Q8 and Q9 of the push-pull output stage, whose bases are connected to outputs of the voltage followers 4 and 5, respectively.

The voltage follower 4 generates a positive side drive voltage upon a voltage of the collector of the transistor Q7 received at a+input thereof. The drive voltage thus generated is applied to the base of the transistor Q8 to drive the latter. The voltage follower 5 generates a negative side drive voltage upon a voltage of the emitter of the transistor Q7 received at a−input thereof. The negative side drive voltage thus generated is applied to the base of the transistor Q9 to drive the latter. Incidentally, the voltage follower 5 receives the voltage fed back to the +input from the output terminal 13.

In the conventional audio power amplifier, the output amplifier circuit 2 is driven by current directly without using the voltage followers 4 and 5. In the present audio power amplifier 10, the CR filter circuit in the form of the series connected resistor R2 and the capacitor Cb is connected to the −input of the differential amplifier 1 and the CR filter circuit in the form of the series circuit of the resistor Ra and the capacitor Ca is connected to the output of the audio power amplifier 10, so that the CR filters are connected to the +input and the −input of the audio power amplifier 10, causing the latter amplifier to easily oscillate. Such defect of this circuit is prevented by setting the phases of the voltages in the input and output sides of the audio power amplifier 10 opposite each other by driving the output transistors Q8 and Q9 through the voltage followers 4 and 5, respectively.

That is, the voltage generated across the resistor R4 is inputted to the base of the output transistor Q8. Further, the voltage generated across the resistor R4 is derived from the emitter of the transistor Q7 by level-shifting it by an amount corresponding to the base bias voltage of the output transistor Q9 and the phase of the level-shifted voltage is inverted by the voltage follower 5. The level-shifted and phase-inverted voltage is inputted to the base of the output transistor Q9, so that the current amplification loop of the audio power amplifier is voltage-controlled. Since, therefore, a voltage following the input side voltage is generated, the oscillation phenomenon of the audio power amplifier, which is caused by phase advance or phase delay at a specific frequency due to the current amplification throughout the conventional audio power amplifier, is restricted and, even if the CR filters are inserted into the input and output sides of the audio signal amplifier, respectively, the audio power amplifier becomes stable.

Describing the amplifying frequency characteristics of the whole audio power amplifier, the output voltage Vp is given by the following equation, when the value of 10 $\mu$F. of the input capacitor Cin is neglected:

$$Vp = Ao\{1 + Rf \| (Ra + 1/j\omega Ca)/Rs\} \times R1/(R1 + R2 + 1/j\omega Cb) \times Vin$$

where Rf, Ra, R1 and R2 are resistance values of the respective resistors Rf, Ra, R1 and R2, Ca and Cb are capacitance values of the respective capacitors Ca and Cb, Vin is a voltage of the input signal, Ao is the amplification of an open loop of this amplifier and Rf∥(Ra+1/j$\omega$Ca) represents a total resistance value of a parallel circuit of the resistor Rf and the output side CR filter in the form of the series circuit of the capacitor Ca and the resistor Ra.

The output voltage Vo supplied to the loud speaker 2, that is, the terminal voltage of the loud speaker 2, is represented by the following equation:

$$Vo = j\omega CoRL \times Vp/(1 + j\omega CoRL)$$

where Co is a capacitance of the output capacitor Co, RL is a resistance or impedance value of the loud speaker 6 and Vp is a voltage at the output terminal 13.

Figure 2:
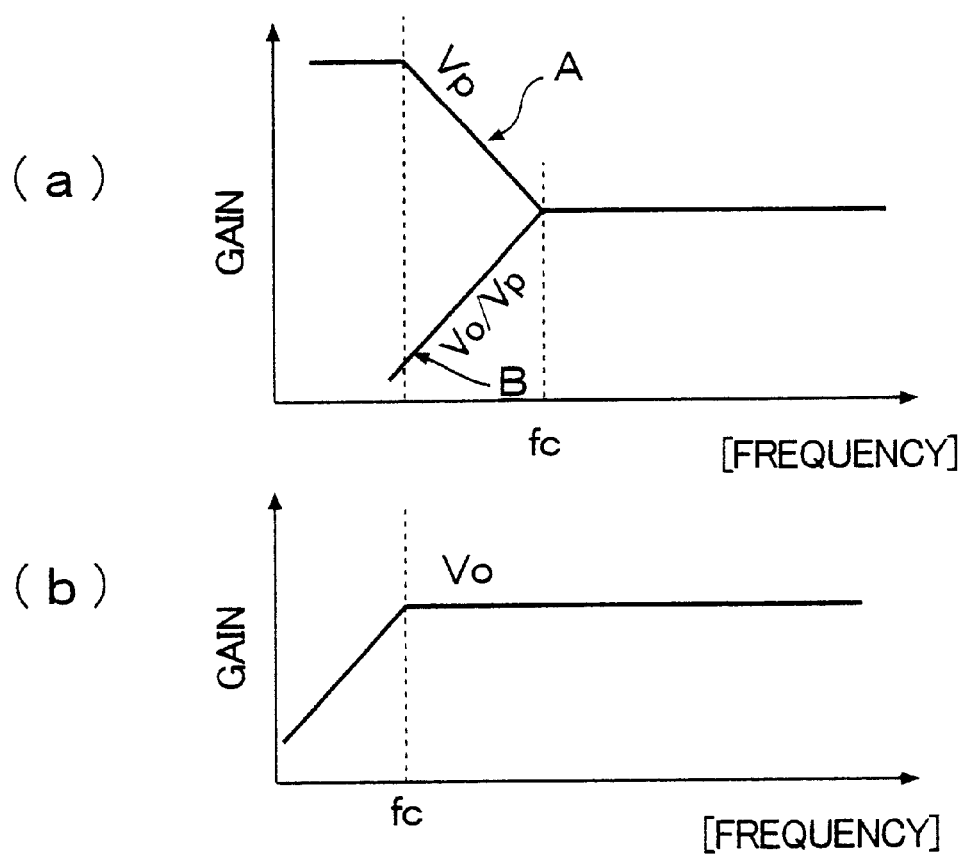
FIG. 2a is a graph of an output voltage of a loud speaker of the audio signal amplifier circuit shown in FIG. 1.
FIG. 2b shows a total characteristics of the audio output circuit shown in FIG. 1.

Gain G of the audio power amplifier 10 for an input signal with respect to the frequency thereof, which is obtained according to the above mentioned equations, is shown in FIG. 2(a) and the total output characteristics in a low frequency range of the loud speaker 2, that is, the gain characteristics of the output voltage Vo, is shown in FIG. 2(b). In FIG. 2(a), a slanted gain curve A shows the voltage gain characteristics at the output terminal 13 and the slanted gain characteristics B shows the voltage gain characteristics of the loud speaker 6 with respect to the output voltage Vp, that is, Vo/Vp characteristics.

Incidentally, fc is a cut-off frequency of the filter.

In FIG. 2(a) and FIG. 2(b), the slant of the characteristics curve A showing an increasing amplification of the audio power amplifier is determined by a time constant of the capacitor Ca and the resistors R1 and R2 and the slant of the characteristics curve B showing decreasing amplification thereof is determined by a time constant of the capacitor Co and the resistance RL of the loud speaker 6. The slants are in a mutually canceling relation.

Although, in the described embodiment, the capacitor Ca is connected to the output terminals 13 and 14 of the IC, it may be possible to connect the capacitor Ca between the output terminal 14 and a junction between the output capacitor Co and the loud speaker 6 as shown in FIG. 1 and as described in U.S. Pat. No. 5,787,182.

What is claimed is:

1. An audio signal amplifier circuit formed as an IC and having an input stage including a differential amplifier and an output stage including a single-ended power amplifier circuit, said audio signal amplifier circuit comprising: an external output terminal of said IC connected to an output line of said single-ended power amplifier circuit; a first resistor connected between a certain terminal of said IC other than said external output terminal and a feedback input of said differential amplifier circuit; a first capacitor connected between said external output terminal and a loud speaker; a second capacitor between said certain terminal of said IC and a wiring line between said external output terminal and said loud speaker; a filter circuit provided on a signal input side of said differential amplifier circuit and including a second resistor and a third capacitor for attenuating signal components having frequencies in a middle and high frequency ranges; and voltage follower means provided between said input stage and said output stage, wherein said first capacitor is a small capacitor having a capacitance value in the order of 30 $\mu$F or smaller and an attenuation characteristics of said first capacitor and an impedance of said loud speaker in a low frequency range is compensated for by a relative amount of increase of amplification gain in the low frequency range determined by a time constant of said second capacitor and said first resistor and a time constant of said third capacitor and said second resistor.

2. An audio signal amplifier circuit as claimed in claim 1, wherein said first capacitor is a chip capacitor externally attached to said IC.

3. An audio signal amplifier circuit as claimed in claim 2, wherein capacitances of said first, second and third capacitors are selected such that the relative amount of increase of amplification gain in the low frequency range determined by the time constant of said second capacitor and said first resistor and the time constant of said third capacitor and said second resistor and the amount of attenuation in the low frequency range determined by the time constant of said first capacitor and said impedance of said loud speaker are substantially canceled each other.

4. An audio signal amplifier circuit as claimed in claim 3, wherein said power amplifier circuit is a push-pull amplifier circuit and said voltage follower means includes a first voltage follower circuit for amplifying an output signal of said differential amplifier circuit while inverting a phase to a positive phase to generate a positive phase drive signal and driving an output circuit on the pushing side of said power amplifier circuit by the positive phase drive signal and a second voltage follower for amplifying an output signal of said differential amplifier circuit while inverting a phase to a negative phase to generate a negative phase drive signal and driving an output circuit on the pulling side of said power amplifier circuit by the negative phase drive signal.

5. An audio signal amplifier circuit as claimed in claim 4, wherein said second capacitor is connected between said certain terminal of said IC and said output terminal.

6. An audio signal amplifier circuit as claimed in claim 4, wherein said second capacitor is connected between said certain terminal and a junction between said first capacitor and said loud speaker.

7. A portable telephone set formed as an IC and including an audio signal amplifier circuit formed and having an input stage including a differential amplifier and an output stage including a single-ended power amplifier circuit, said portable telephone set comprising: an external output terminal of said IC connected to an output line of said single-ended power amplifier circuit; a first resistor connected between a certain terminal of said IC other than said external output terminal and a feedback input of said differential amplifier circuit; a first capacitor connected between said external output terminal and a loud speaker; a second capacitor between said certain terminal of said IC and a wiring line between said external output terminal and said loud speaker; a filter circuit provided on a signal input side of said differential amplifier circuit and including a second resistor and a third capacitor for attenuating signal components having frequencies in a middle and high frequency ranges; and voltage follower means provided between said input stage and said output stage, wherein said first capacitor is a small capacitor having a capacitance value in the order of 30 $\mu$F or smaller and an attenuation characteristics of said first capacitor and an impedance of said loud speaker in a low frequency range is compensated for by a relative amount of increase of amplification gain in the low frequency range determined by a time constant of said second capacitor and said first resistor and a time constant of said third capacitor and said second resistor.

8. A portable telephone set as claimed in claim 7, wherein said first capacitor is a chip capacitor externally attached to said IC.

9. A portable telephone set as claimed in claim 8, wherein capacitances of said first, second and third capacitors are selected such that the relative amount of increase of amplification gain in the low frequency range determined by the time constant of said second capacitor and said first resistor and the time constant of said third capacitor and said second resistor and the amount of attenuation in the low frequency range determined by the time constant of said first capacitor and said impedance of said loud speaker are substantially canceled each other.

10. A portable telephone set as claimed in claim 9, wherein said power amplifier circuit is a push-pull amplifier circuit and said voltage follower means includes a first voltage follower circuit for amplifying an output signal of said differential amplifier circuit while inverting a phase to a positive phase to generate a positive phase drive signal and driving an output circuit on the pushing side of said power amplifier circuit and a second voltage follower for amplifying an output signal of said differential amplifier circuit while inverting a phase to a negative phase to generate a negative phase drive signal and driving an output circuit on the pulling side of said power amplifier circuit.

11. A portable telephone set as claimed in claim 9, wherein said second capacitor is connected between said certain terminal and said output terminal.

12. A portable telephone set as claimed in claim 10, wherein said second capacitor is connected between said certain terminal and a junction between said first capacitor and said loud speaker.

13. A portable electronic device formed as an IC and including an audio signal amplifier circuit formed and having an input stage including a differential amplifier and an output stage including a single-ended power amplifier circuit, said portable electronic device comprising: an external output terminal of said IC connected to an output line of said single-ended power amplifier circuit; a first resistor connected between a certain terminal of said IC other than said external output terminal and a feedback input of said differential amplifier circuit; a first capacitor connected between said external output terminal and a loud speaker; a second capacitor between said certain terminal of said IC and a wiring line between said external output terminal and said loud speaker; a filter circuit provided on a signal input side of said differential amplifier circuit and including a second resistor and a third capacitor for attenuating signal components having frequencies in a middle and high frequency ranges; and voltage follower means provided between said input stage and said output stage, wherein said first capacitor is a small capacitor having a capacitance value in the order of 30 $\mu$F. or smaller and an attenuation characteristics of said first capacitor and an impedance of said loud speaker in a low frequency range is compensated for by a relative amount of increase of amplification gain in the low frequency range determined by a time constant of said second capacitor and said first resistor and a time constant of said third capacitor and said second resistor.

14. A portable electronic device as claimed in claim 13, wherein said first capacitor is a chip capacitor externally attached to said IC.

15. A portable electronic device as claimed in claim 14, wherein capacitances of said first, second and third capacitors are selected such that the relative amount of increase of amplification gain in the low frequency range determined by the time constant of said second capacitor and said first resistor and the time constant of said third capacitor and said second resistor and the amount of attenuation in the low frequency range determined by the time constant of said first capacitor and said impedance of said loud speaker are substantially canceled each other.

16. A portable electronic device as claimed in claim 15, wherein said power amplifier circuit is a push-pull amplifier circuit and said voltage follower means includes a first voltage follower circuit for amplifying an output signal of said differential amplifier circuit while inverting a phase to a positive phase to generate a positive phase drive signal and driving an output circuit on the pushing side of said power amplifier circuit and a second voltage follower for amplifying an output signal of said differential amplifier circuit while inverting a phase to a negative phase to generate a negative phase drive signal and driving an output circuit on the pulling side of said power amplifier circuit.

* * * * *